United States Patent
Lu et al.

(10) Patent No.: US 7,643,849 B2
(45) Date of Patent: Jan. 5, 2010

(54) CELLULAR PHONE DATA COMMUNICATION SYSTEM WHEREIN A PARALLEL INTERFACED BASEBAND MODULE AND A SERIAL INTERFACED MULTIMEDIA MODULE ARE COUPLED TO ONE ANOTHER USING A PARALLEL/SERIAL CONVERSION MODULE

(75) Inventors: Chih-Hung Lu, Hsinchu (TW); Ming-Ta Liu, Hsinchu (TW); Cho-Yi Lin, Hsinchu (TW)

(73) Assignee: PIXART Imaging Inc., Hsinchu (TW)

( * ) Notice: Subject to any disclaimer, the term of this patent is extended or adjusted under 35 U.S.C. 154(b) by 450 days.

(21) Appl. No.: 11/420,958

(22) Filed: May 30, 2006

(65) Prior Publication Data
US 2007/0281741 A1 Dec. 6, 2007

(51) Int. Cl.
*H04B 1/40* (2006.01)
*H04M 1/00* (2006.01)
(52) U.S. Cl. .................. 455/556.1; 455/557
(58) Field of Classification Search ........... 455/556.1, 455/557, 566, 575.1, 414.1, 550.1
See application file for complete search history.

(56) References Cited

U.S. PATENT DOCUMENTS

| | | | | |
|---|---|---|---|---|
| 3,678,391 A | * | 7/1972 | Gough | 370/313 |
| 7,345,683 B2 | * | 3/2008 | Lee | 345/204 |
| 2005/0007358 A1 | | 1/2005 | Lee | |
| 2005/0113146 A1 | * | 5/2005 | Kang | 455/566 |
| 2005/0277164 A1 | * | 12/2005 | Drucker et al. | 435/14 |
| 2006/0052072 A1 | * | 3/2006 | Hess et al. | 455/127.4 |
| 2006/0184987 A1 | * | 8/2006 | Allen et al. | 725/100 |

FOREIGN PATENT DOCUMENTS

TW     I241821     10/2005

* cited by examiner

*Primary Examiner*—Blane J Jackson
(74) *Attorney, Agent, or Firm*—Stevens & Showalter LLP

(57) ABSTRACT

A data communication system comprises a radio frequency module, a baseband module, a memory unit, a parallel/serial module, a multimedia module, an image sensor module and a display module. The parallel/serial module performs digital signal processing and converts parallel bus data into serial bus data, and vice versa. The present invention provides an improved data communication method and system featuring a parallel/serial module that enables a serial data communication within cellular phone modules. The present invention will also reduce the cost of manufacturing and improve the performance of the cellular phone.

18 Claims, 7 Drawing Sheets

CELLULAR PHONE DATA COMMUNICATION SYSTEM WHEREIN A PARALLEL INTERFACED BASEBAND MODULE AND A SERIAL INTERFACED MULTIMEDIA MODULE ARE COUPLED TO ONE ANOTHER USING A PARALLEL/SERIAL CONVERSION MODULE

BACKGROUND

1. Field of the Invention

The present invention relates generally to a data communication method and system and more particularly to a data communication method and system applied in-between cellular phone modules.

2. Background of the Invention

Along with the rapid growth in the electronic products industry, new telecommunication products are continuously being developed. In recent years, portable electronic products, such as cellular phones, cover a versatile range of functions and have become a necessity to people in their everyday lives.

Cellular phone handsets have become so small that all cellular phone modules must be arranged in a more compact way. A traditional parallel data bus communicating with cellular phone modules and occupying a lot of layout space thus needs to be changed in order to accommodate new technology.

One device discloses a data communication system within a cellular phone handset, which allows an image processor to process the image data captured by an image sensor and directly send the processed image data to a display module without occupying the resource of a central processing unit. Another device discloses a data communication system within a cellular phone handset wherein a handset user can capture and view the image data without interrupting the voice communication between the handset user and a remote handset user. All cellular phone modules inside these two disclosures use a parallel data bus to communicate with each other.

Therefore, there is a need for an improved data communication method and system featuring a parallel/serial module that enables a serial data communication within cellular phone modules. The improved method and system will also reduce the cost of manufacturing and improve the performance of the cellular phone.

SUMMARY

In order to overcome the disadvantages of the conventional method, the present invention provides an improved data communication method and system featuring a parallel/serial conversion module that enables a serial data communication within cellular phone modules, wherein the slash "/" in parallel/serial represents a bi-directional conversion.

The data communication system comprises a radio frequency module, a baseband module, a memory module, a parallel/serial conversion module, a multimedia module, an image sensor module, and a display module. The parallel/serial conversion module performs digital signal processing and converts parallel bus data into serial bus data and vice versa.

An advantage of the present invention is that it can be achieved by utilizing a flexible print circuit with a serial data bus to further reduce the manufacturing cost and layout space.

The present invention can be used for data communication in a clamshell phone, a slideup phone and a bartype phone.

BRIEF DESCRIPTION OF THE DRAWINGS

For a more complete understanding of the invention, and the advantages thereof, reference is made to the following descriptions taken in conjunction with the accompanying drawings, in which.

DETAILED DESCRIPTION

The preferred embodiments of the present invention disclose a data communication system and method featuring a parallel/serial conversion module (P/S) having an improved performance. By applying a parallel/serial conversion module to interface with a baseband module, a parallel data bus from the baseband module is coupled to the parallel/serial conversion module. The parallel/serial conversion module processes the parallel bus data coming from the parallel data bus and converts the parallel bus data into serial bus data and sends to a serial data bus. In the same manner, the parallel/serial conversion module processes the serial bus data coming from the serial data bus and converts the serial bus data into parallel bus data and sends to the parallel data bus. It should be clear to those experienced in the art that the present invention can be applied and extended without deviating from the scope of the invention.

First Embodiment

Figure 1:
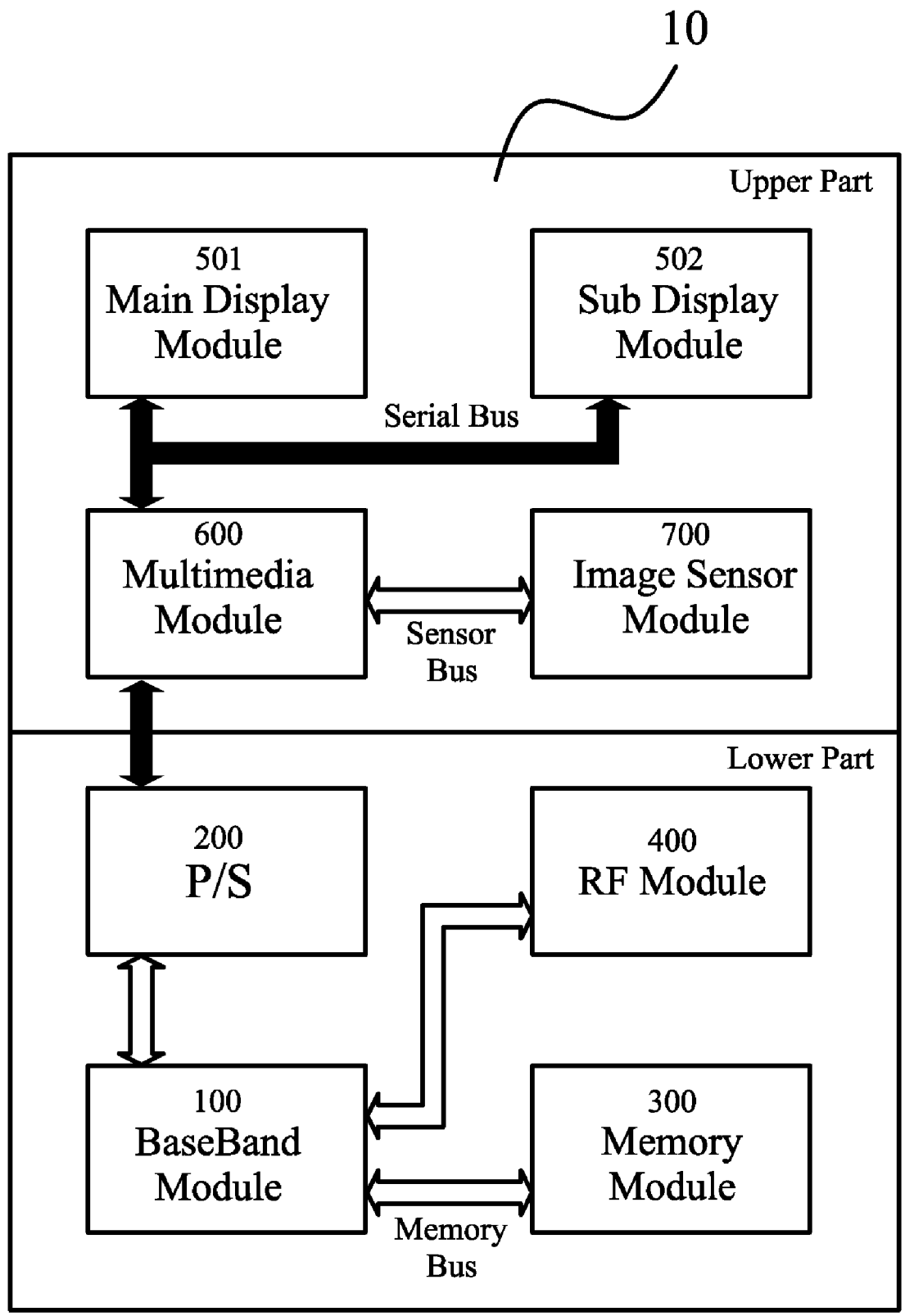
FIG. 1 illustrates a block diagram of a data communication system featuring a parallel/serial conversion module in accordance with one embodiment of the present invention.

In FIG. 1, a block diagram illustrates a data communication system featuring a parallel/serial conversion module according to one embodiment of the present invention.

As shown in FIG. 1, the data communication system 10 of the present invention comprises a baseband module 100, a parallel/serial conversion module 200, a memory module 300, a radio frequency module 400, a main display module 501, a sub-display module 502, a multimedia module 600, and an image sensor module 700.

A baseband processing is at the heart of every wireless product. The baseband module 100 receives signals from the radio frequency module 400 and processes the signals. It then sends the processed signals to the radio frequency module 400 to communicate with a remote handset user. In some applications, the baseband module 100 may separate into an analog baseband module which specializes in analog signal processing and a digital baseband module which specializes in digital signal processing. An analog-to-digital converter and a digital-to-analog converter may further be included to allow signals communicating within these two modules.

The parallel/serial module 200 processes and converts parallel bus data into serial bus data, and in a bi-directional manner, processes and converts serial bus date into parallel bus data.

The memory module 300 allows data to be stored inside the cellular phone system. This data can be stored and recalled by a user. The memory module can be, for example, a static random access memory (SRAM), a dynamic random access memory (DRAM, SDRAM, DDR, DDRII), a Flash memory (NAND Flash, NOR Flash), read only memory (ROM, EPROM, EEPROM) or other type of memory. The SRAM is a volatile memory. A volatile memory is a memory whose data will vanish when a power supplied to the memory is removed. Data held in a SRAM cell are stored in a pair of cross-coupled inverters, known as a latch. The SRAM can be powered by a battery of the cellular phone system in order to retain the storage data when the cellular phone is turned off. The DRAM is also a volatile memory. It uses one capacitor to store data per memory cell. The DRAM requires periodic refresh signals to hold the correct data within the memory cell. The Flash memory is a non-volatile memory. It uses a floating gate of a specific cell to retain charge. The Flash memory allows the data to be stored without being lost when the power is off. Generally, the SRAM has a faster operation speed than the Flash memory. The ROM is a non-volatile memory. Once the data is stored in a ROM memory cell, it can not be changed. However, some specific kinds of ROM can be erased with an ultraviolet light source or an electric field such as EPROM or EEPROM. Various kinds of data can be stored in the memory module 300, for examples: cellular phone's operating system, captured image data, customizable features (such as the phone directory) communication protocol, user interface protocol, audio function, video function and et al. In one embodiment of the present invention the memory module 300 may be optional.

The radio frequency module 400 further comprises a receiver and a transmitter module which receives and transmits wireless signals from and to other handsets. In one embodiment of the present invention the radio frequency module 400 may be optional.

The main display module 501 and the sub-display module 502 are for displaying data, status, or other information on a screen for the user. An example of the display is a liquid crystal display.

The multimedia module 600 processes the image data captured by a image sensor and stores the image data inside the memory unit 300 for future retrieval. The image sensor module 700 can be a charge-coupled device (CCD) sensor, a complementary metal oxide semiconductor (CMOS) sensor, a hybrid imaging technology sensor, a silicon on insulator sensor, or other type of image sensor. The image sensor module 700 allows the users to capture visual data such as photographs or movies.

Figure 2:
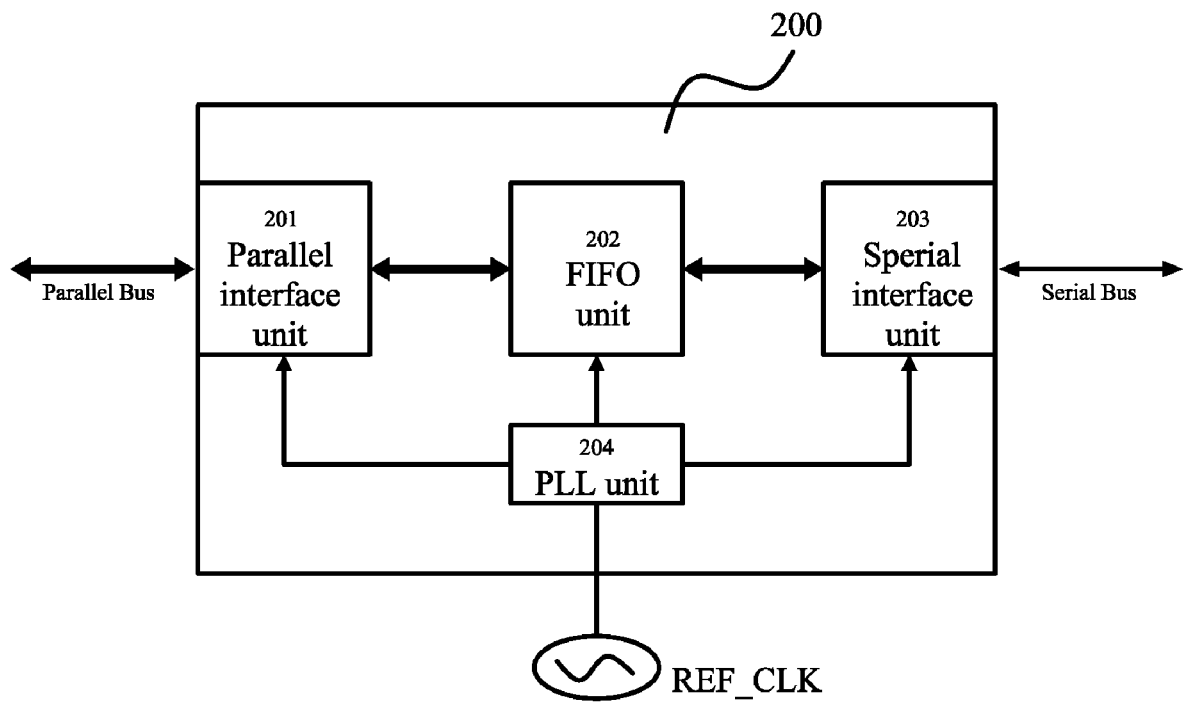
FIG. 2 illustrates a block diagram of a parallel/serial conversion module.

In FIG. 2, a block diagram illustrates a parallel/serial conversion module according to one embodiment of the present invention.

As shown in FIG. 2, the parallel/serial conversion module 200 comprises a parallel interface unit 201, a first-in-first-out unit (FIFO) 202, a serial interface unit 203, a phase locked loop (PLL) unit 204, and an external reference clock signal.

The parallel interface unit 201 is coupled to a parallel data bus and processes parallel bus data from the parallel data bus. The parallel interface unit 201 can be, for example, a LCD interface bus and a memory interface bus such as a M68, or an I80 and a flash interface. A first-in-first-out unit 202 is connected to the parallel interface unit 201. First-in-first-out is used commonly in electronic circuits for buffering and flow control. In hardware form a first-in-first-out primarily consists of a set of read and write pointers, storage, and control logic. A synchronous first-in-first-out is a first-in-first-out where the same clock is used for both reading and writing. The first-in-first-out unit 202 processes the parallel data coming from the parallel interface unit 201 and converts the parallel data into serial data and sends to a serial interface unit 203 sequentially, and vice versa. A serial interface unit 203 is used to interface with the first-in-first-out unit 202 and a serial data bus. The serial data bus is a bus which processes data one bit at a time, sequentially. The serial data bus further comprises a chip select signal and a clock signal. The serial interface unit 203 can be, for example, a serial peripheral interface (SPI), an universal asynchronous receiver transmitter (UART), an I2C, a system management bus (SMB), an I2S or a Microwire. A phase locked loop unit (PLL) 204 is responsible for interfacing with the parallel interface unit 201, the first-in-first-out unit 202, and the serial interface unit 203. The phase locked loop unit 204 is a closed-loop feedback control system that maintains a generated signal in a fixed phase relationship to a reference signal. An external reference clock is provided to the phase locked loop as a reference signal.

Several different buses allow data to communicate between different cellular phone modules. A parallel data bus connects the baseband module 100 and the parallel/serial conversion module 200. A serial data bus connects the parallel/serial conversion module 200 and the multimedia module 600 and the main display module 501 and the sub-display module 502.

Figure 3:
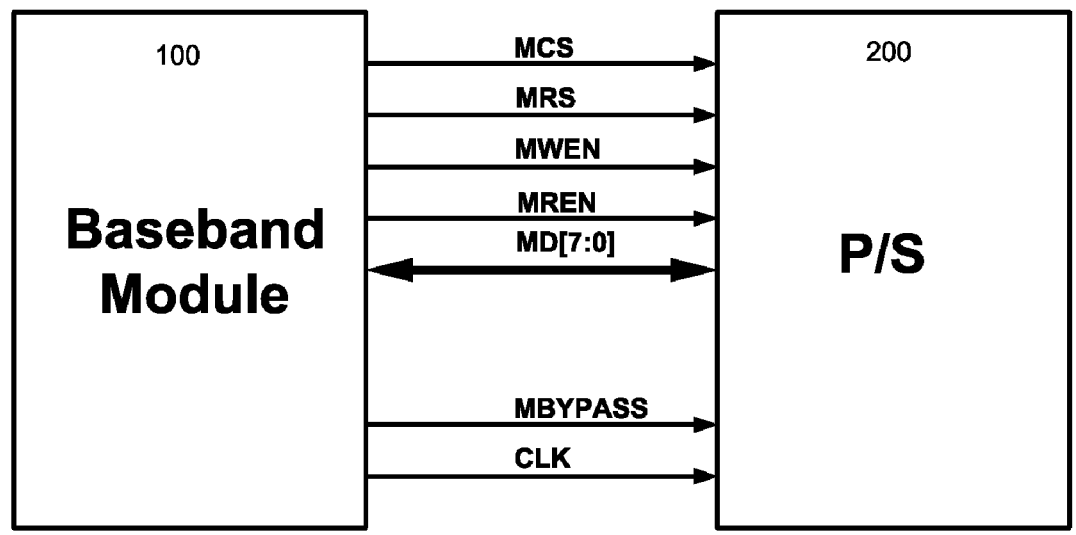
FIG. 3 illustrates a block diagram of a parallel interface connecting a baseband module and a parallel/serial conversion module.

In FIG. 3, a block diagram illustrates a parallel interface between a baseband module 100 and a parallel/serial conversion module 200 according to one embodiment of the present invention.

As shown in FIG. 3, the parallel interface of the present invention comprises a chip select signal MCS, a register select signal MRS, a write enable signal MWEN, a read enable signal MREN, a 8-bit parallel data bus MD[7:0], a bypass signal MBYPASS and a clock signal CLK.

The bypass signal MBYPASS is initiated by the baseband module 100. When MBYPASS is logic high, signals from parallel/serial conversion module 200 are directly bypassed to the main display module 501 and the sub-display module 502, i.e. the multimedia module 600 is transparent. The clock signal CLK is provided for the reference clock signal REF_CLK within the parallel/serial conversion module 200. Accordingly, phase locked loop unit 204 generates parallel/serial conversion module's system clock based on this REF_CLK.

Figure 4:
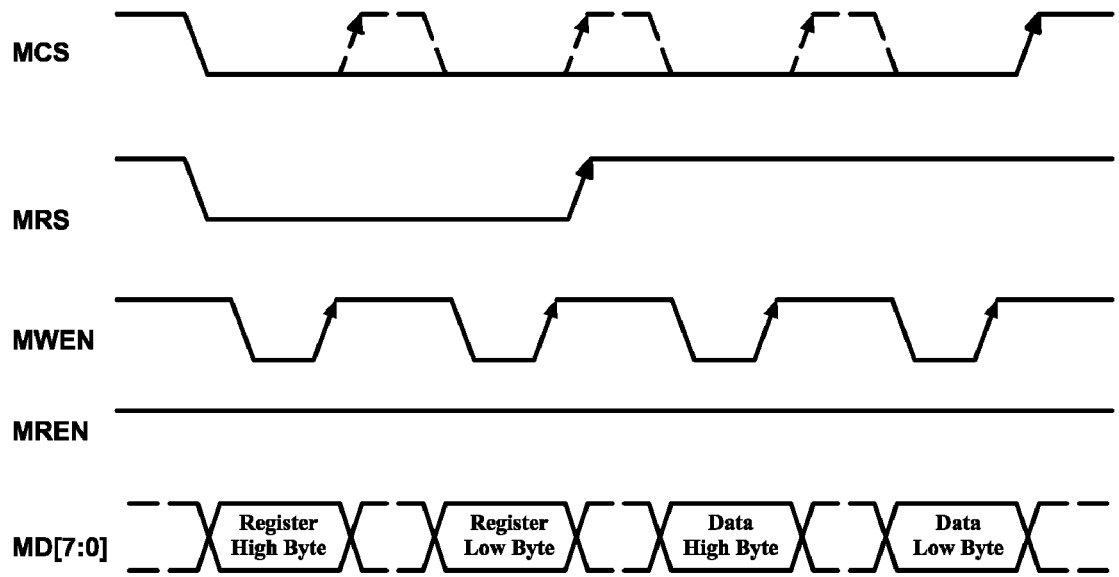
FIG. 4 illustrates a write timing diagram of an 8-bit parallel bus.
Figure 5:
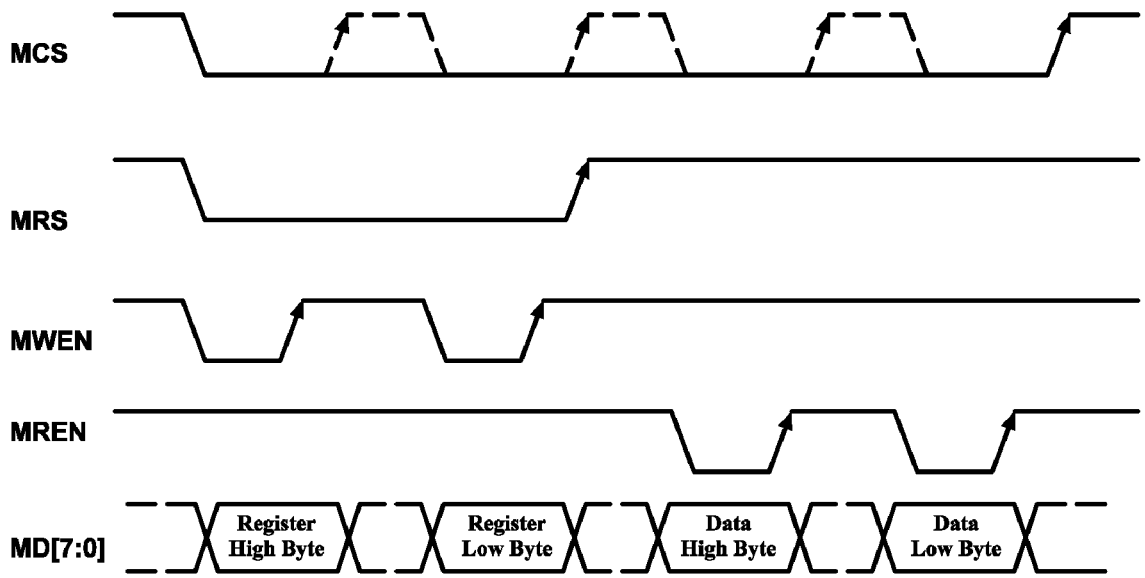
FIG. 5 illustrates a read timing diagram of an 8-bit parallel bus.

In FIGS. 4 and 5, two timing diagrams illustrate a write and a read timing sequences for an 8-bit parallel bus according to one embodiment of the present invention.

As shown in FIG. 4, the write timing diagram of the present invention comprises a chip select signal MCS, a register select signal MRS, a write enable signal MWEN, a read enable signal MREN, and an 8-bit parallel data bus MD[7:0].

The baseband module 100 enables the parallel/serial conversion module 200 to write data from the baseband module 100 when the chip select signal MCS is logic low. A trapezoid dotted line signal of the chip select signal MCS shows that data transfer is disabled. The data bus is in an idle state and no more data are transferred. A register is ready to be accessed when the register select signal MRS is logic low. It takes 4 cycles to complete a process for writing data to the register. When write enable signal MWEN keeps logic low at a first cycle and a second cycle, these two cycles are for register write address setting. When write enable signal MWEN keeps logic low at a third cycle and a fourth cycle, these two cycles are processing register data writing.

As shown in FIG. 5, the read timing diagram of the present invention comprises a chip select signal MCS, a register select signal MRS, a write enable signal MWEN, a read enable signal MREN, and an 8-bit parallel data bus MD[7:0].

The baseband module 100 enables the parallel/serial conversion module 200 to read data from the baseband module 100 when the chip select signal MCS is logic low. A trapezoid dotted line signal of the chip select signal MCS shows that data transfer is disabled. The data bus is in an idle state and no more data are transferred. A register is ready to be accessed when the register select signal MRS is logic low. It takes 4 cycles to complete a process for reading data from the register. When write enable signal MWEN keeps logic low at a first cycle and a second cycle, these two cycles are for register read address setting. When read enable signal MREN keeps logic low at a third cycle and a fourth cycle, these two cycles are processing register data reading.

Figure 6:
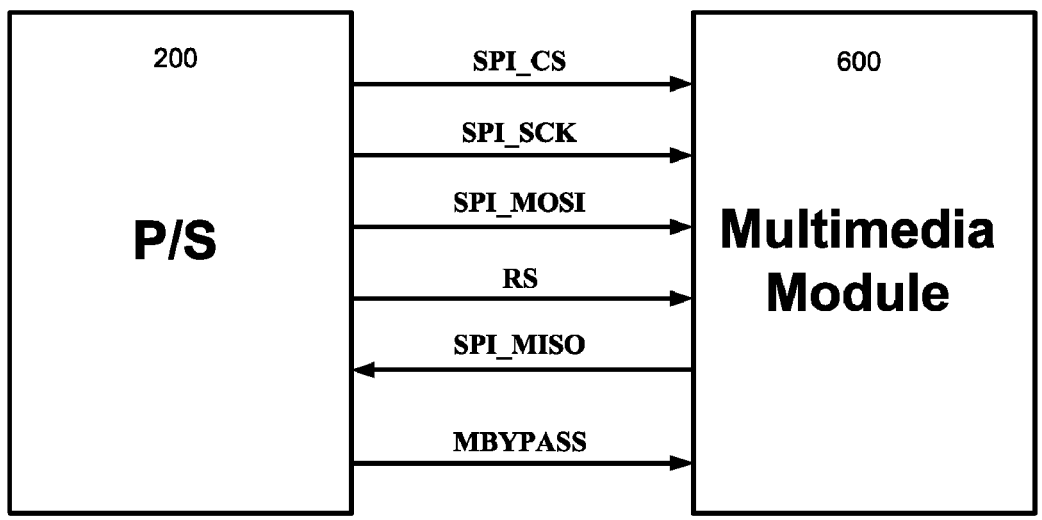
FIG. 6 illustrates a block diagram of a serial interface connecting a parallel/serial conversion module and a multimedia module.

In FIG. 6, a block diagram illustrates a serial interface between a parallel/serial conversion module 200 and a multimedia module 600 according to one embodiment of the present invention.

As shown in FIG. 6, the serial interface of the present invention comprises a serial peripheral interface chip select signal SPI_CS, a register select signal RS, a serial peripheral interface clock input signal SPI_SCK, a serial peripheral interface data output SPI_MOSI, a serial peripheral interface data input SPI_MISO, and a bypass signal MBYPASS.

The bypass signal MBYPASS is initiated by the baseband module 100. When MBYPASS is logic high, signals from parallel/serial conversion module 200 are directly bypassed to the main display module 501 and the sub-display module 502, i.e. the multimedia module 600 is transparent.

Figure 7:
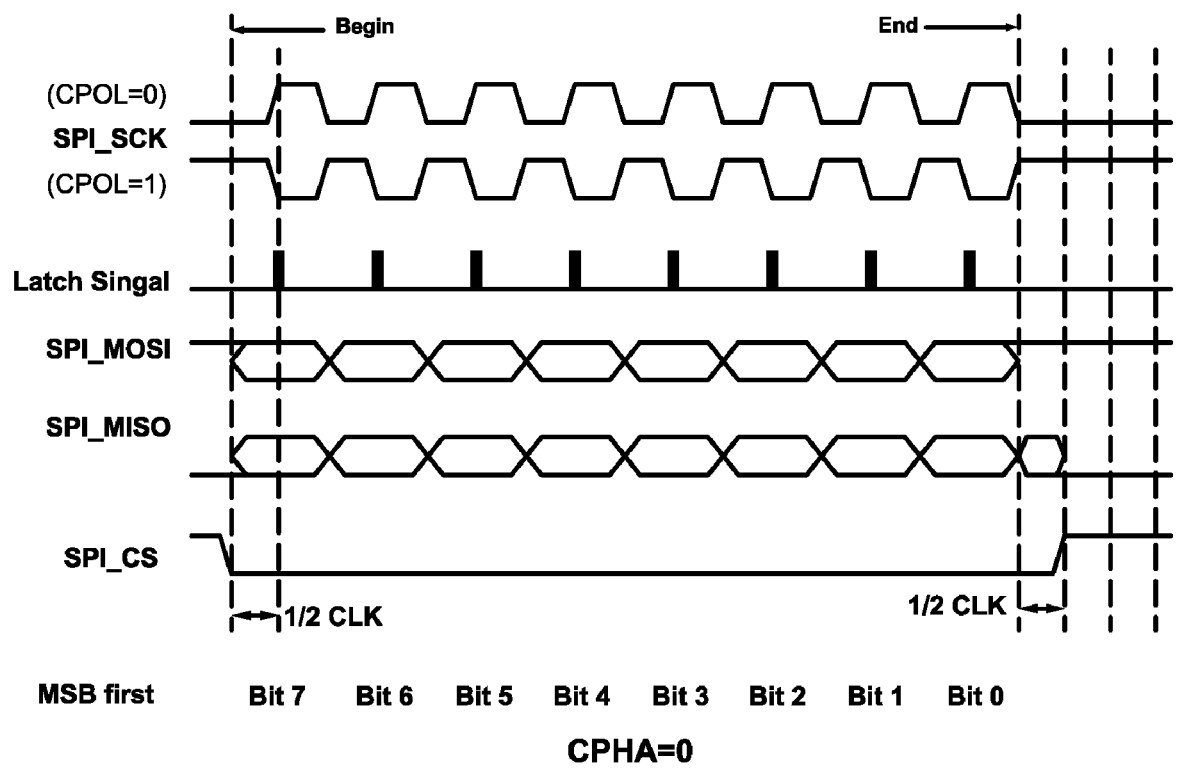
FIG. 7 illustrates a timing diagram of a serial peripheral interface clock format (CPHA=0).
Figure 8:
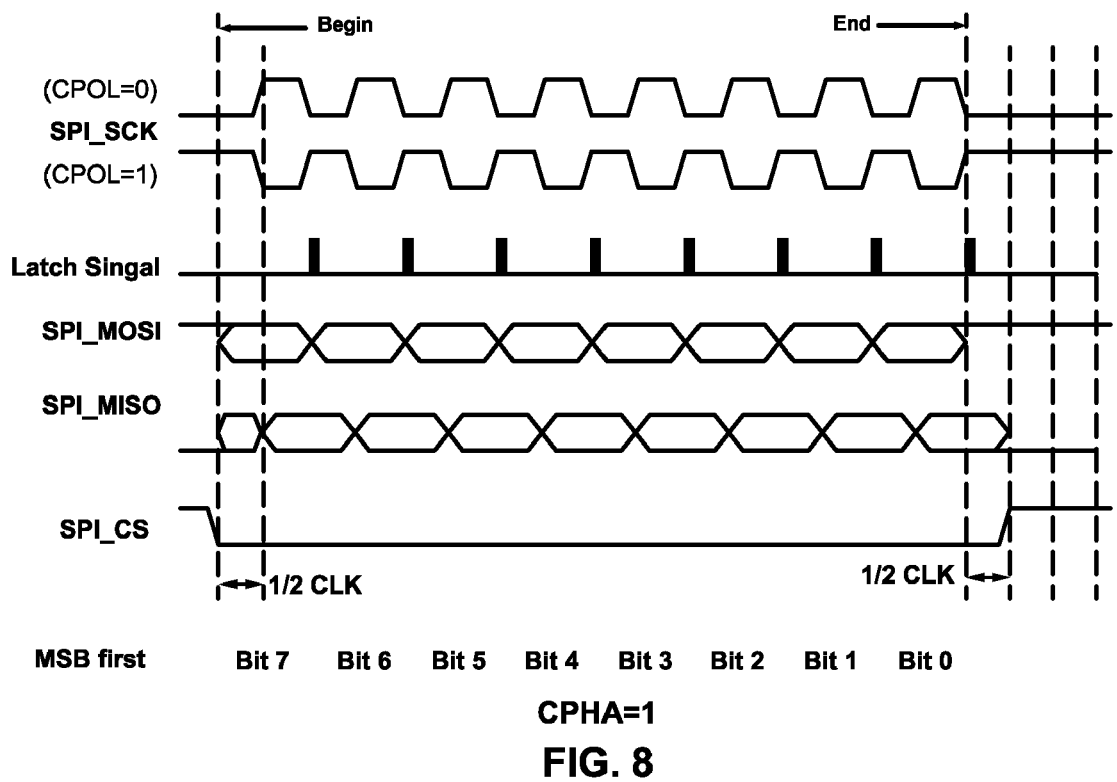
FIG. 8 illustrates a timing diagram of a serial peripheral interface clock format (CPHA=1).

In FIGS. 7 and 8, two timing diagrams illustrate two serial peripheral interface clock formats according to one embodiment of the present invention.

As shown in FIGS. 7 and 8, the write timing diagram of the present invention comprises a chip select signal SPI_CS, a clock signal SPI_SCK, a data output SPI_MOSI, a data input SPI_MISO and a latch signal.

The clock signal SPI_SCK further comprises a clock polarity control bit CPOL specifying an active high (CPOL=0) or low (CPOL=1) clock and having no significant effect on the transmission format. A clock phase control bit CPHA specifies the data will be latched at a first edge of a clock pulse when CPHA=0. The data will be latched at a second edge of a clock pulse when CPHA=1.

Figure 9:
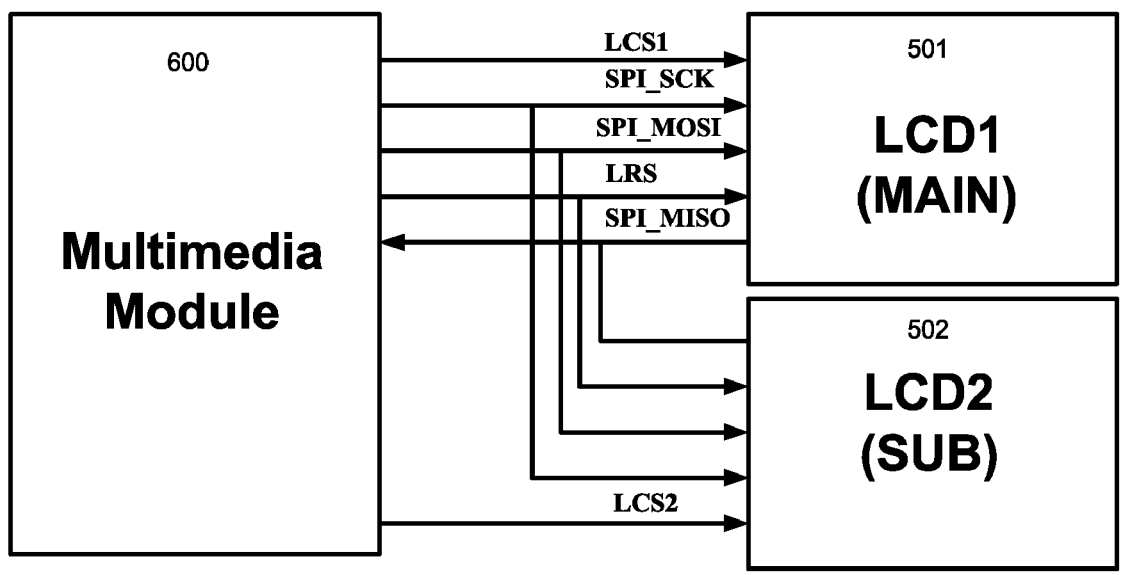
FIG. 9 illustrates a block diagram of a serial interface connecting a multimedia module and a main display module and a sub-display module.

In FIG. 9, a block diagram illustrates a serial interface between a multimedia module 600, and a main display module 501 and a sub-display module 502 according to one embodiment of the present invention.

As shown in FIG. 9, the serial interface comprises chip select signals LCS1 and LCS2, a register select signal LRS, a serial peripheral interface clock input signal SPI_SCK, a serial peripheral interface data output SPI_MOSI, and a serial peripheral interface data input SPI_MISO.

Since the serial interface embodied in FIG. 9 is a serial peripheral interface, it has a similar timing diagram as shown in FIGS. 7 and 8.

Second Embodiment

Figure 10:
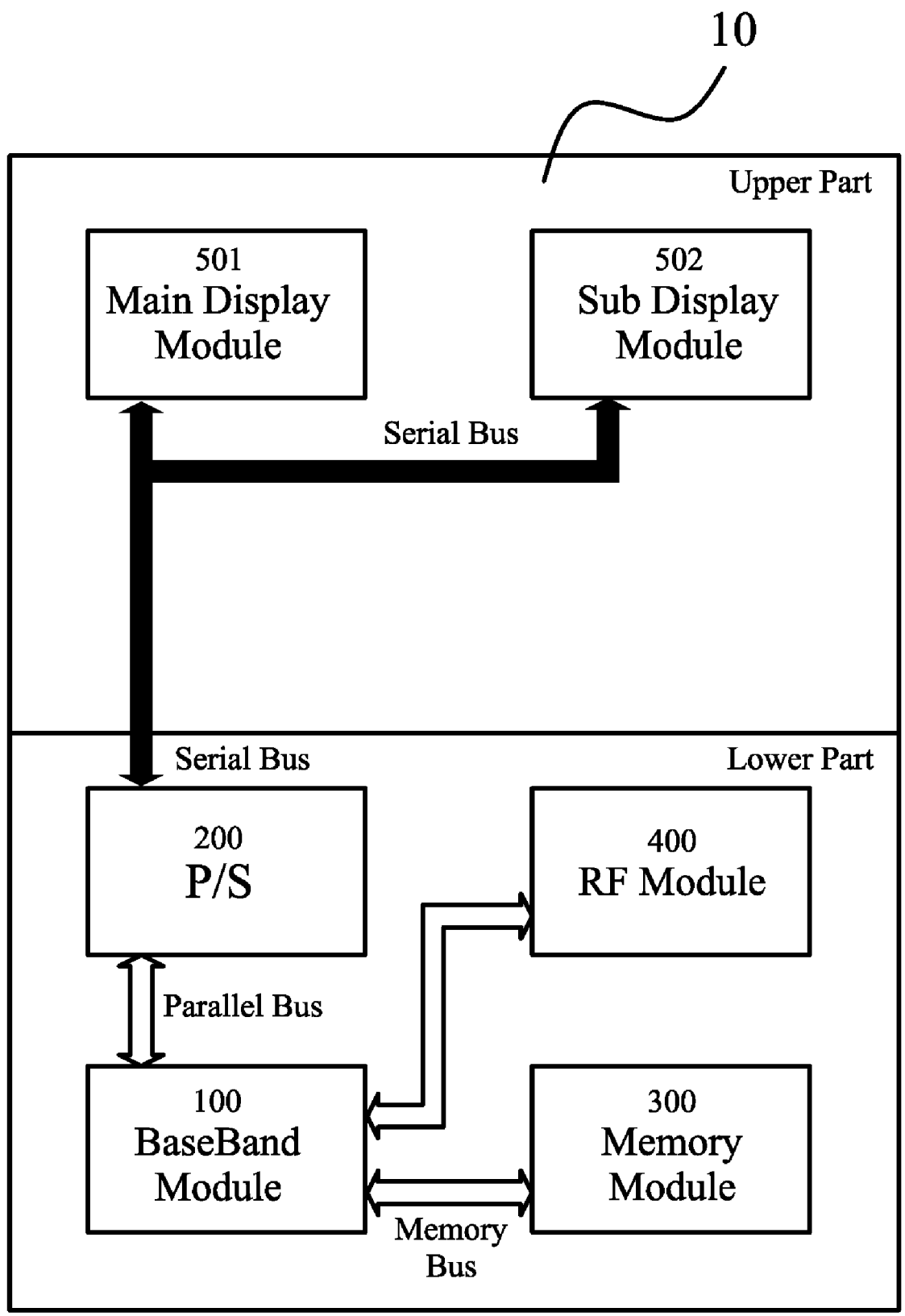
FIG. 10 illustrates a block diagram of a data communication system featuring a parallel/serial conversion module in accordance with one embodiment of the present invention.

In FIG. 10, a block diagram illustrates a data communication system featuring a parallel/serial conversion module according to another embodiment of the present invention.

As shown in FIG. 10, the data communication system 10 comprises a baseband module 100, a parallel/serial conversion module 200, a memory module 300, a radio frequency module 400, a main display module 501, and a sub-display module 502 which operate in a similar manner as with the embodiment illustrated in FIG. 1. However, in this embodiment the parallel/serial conversion module is directly connected to both the main display module 501 and the sub-display module 502.

Figure 11:
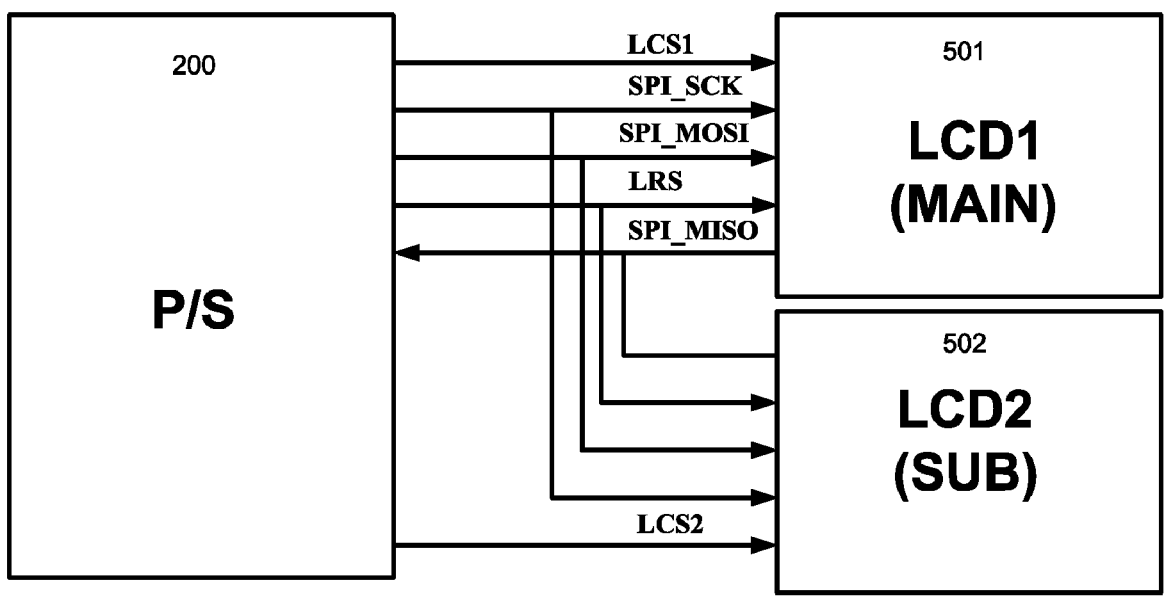
FIG. 11 illustrates a block diagram of a serial interface connecting a parallel-to-serial module and a main display module and a sub-display module.

In FIG. 11, a block diagram illustrates a serial interface between a parallel/serial conversion module 200, and a main display module 501 and a sub-display module 502 according to one embodiment of the present invention.

As shown in FIG. 11, the serial interface comprises chip select signals LCS1 and LCS2, a register select signal LRS, a serial peripheral interface clock input signal SPI_SCK, a serial peripheral interface data output SPI_MOSI, and a serial peripheral interface data input SPI_MISO.

Since the serial interface embodied in FIG. 11 is a serial peripheral interface, it has a similar timing diagram as shown in FIGS. 7 and 8.

An advantage of the present invention is that the invention can be achieved by utilizing a flexible print circuit with a serial data bus to further reduce the manufacturing cost and layout space.

While the invention has been described with reference to various illustrative embodiments, the description is not intended to be construed in a limiting sense. The appended claims will cover any modifications or embodiments as may fall within the scope of the present invention.

What is claimed is:

1. A data communication system in a cellular phone device, comprising:
   a baseband module with a parallel interface;
   a multimedia module with a serial interface;
   a parallel/serial conversion module coupled to said baseband module and said multimedia module, wherein the parallel/serial conversion module comprises a parallel interface unit with a parallel bus; a first-in-first-out unit coupled to said parallel interface unit; a serial interface unit with a serial bus coupled to said first-in-first-out unit; and a phase locked loop unit that tunes a clock for said parallel interface unit, said first-in-first-out unit, and said serial interface unit;
   a display module coupled to said multimedia module;
   a first serial bus connecting said parallel/serial module and said multimedia module;
   a second serial bus connecting said multimedia module and said display module; and
   a bypass signal to enable data to bypass said multimedia module directly from said first serial bus to said second serial bus.

2. The system as claimed in claim 1, further comprising an image sensor module coupled to said multimedia module via a sensor bus.

3. The system as claimed in claim 1, further comprising a radio frequency module coupled to said baseband module.

4. The system as claimed in claim 1, further comprising a memory module coupled to said baseband module via a memory bus.

5. The system as claimed in claim 1, wherein said first serial bus is a bus selected from a group consisting of a SPI, an UART, an I2C, a SMB, an I2S, and a Microwire.

6. The system as claimed in claim 1, wherein said second serial bus is a bus selected from a group consisting of a SPI, an UART, an I2C, a SMB an I2S, and a Microwire.

7. The system as claimed in claim 1, wherein said display module comprises a first display unit and a second display unit.

8. The system as claimed in claim 1, wherein said display module comprises a liquid crystal display.

9. A data communication system in a cellular phone device, comprising:
    a baseband module with a parallel interface;
    a multimedia module with a serial interface;
    a parallel/serial conversion module coupled to said baseband module and said multimedia module, wherein the parallel/serial conversion module comprises a parallel interface unit with a parallel bus; a first-in-first-out unit coupled to said parallel interface unit; a serial interface unit with a serial bus coupled to said first-in-first-out unit; and a phase locked loop unit that tunes a clock for said parallel interface unit, said first-in-first-out unit, and said serial interface unit;
    a display module coupled to said multimedia module;
    a first serial bus connecting said parallel/serial module and said multimedia module;
    a second serial bus connecting said multimedia module and said display module; and;
    a bypass signal to enable data to bypass said multimedia module directly from said second serial bus to said first serial bus.

10. The system as claimed in claim 9, further comprising an image sensor module coupled to said multimedia module via a sensor bus.

11. The system as claimed in claim 9, further comprising a radio frequency module coupled to said baseband module.

12. The system as claimed in claim 9, further comprising a memory module coupled to said baseband module via a memory bus.

13. The system as claimed in claim 9, wherein said first serial bus is a bus selected from a group consisting of a SPI, an UART, an I2C, a SMB, an I2S, and a Microwire.

14. The system as claimed in claim 9, wherein said second serial bus is a bus selected from a group consisting of a SPI, an UART, an I2C, a SMB, an I2S, and a Microwire.

15. The system as claimed in claim 9, wherein said display module comprises a first display unit and a second display unit.

16. The system as claimed in claim 9, wherein said display module comprises a liquid crystal display.

17. A data communication system in a cellular phone device, comprising:
    a baseband module with a parallel interface;
    a multimedia module with a serial interface;
    a parallel/serial conversion module coupled to said baseband module and said multimedia module;
    a display module coupled to said multimedia module;
    a first serial bus connecting said parallel/serial module and said multimedia module;
    a second serial bus connecting said multimedia module and said display module; and,
    a bypass signal to enable data to bypass said multimedia module directly from said first serial bus to said second serial bus.

18. A data communication system in a cellular phone device, comprising:
    a baseband module with a parallel interface;
    a multimedia module with a serial interface;
    a parallel/serial conversion module coupled to said baseband module and said multimedia module;
    a display module coupled to said multimedia module;
    a first serial bus connecting said parallel/serial module and said multimedia module;
    a second serial bus connecting said multimedia module and said display module; and,
    a bypass signal to enable data to bypass said multimedia module directly from said second serial bus to said first serial bus.

* * * * *